United States Patent
Murphy

(10) Patent No.: US 7,528,422 B2
(45) Date of Patent: May 5, 2009

(54) PACKAGE FOR A LIGHT EMITTING ELEMENT WITH INTEGRATED ELECTROSTATIC DISCHARGE PROTECTION

(75) Inventor: Thomas Murphy, Berlin (DE)

(73) Assignee: Hymite A/S (DK)

( * ) Notice: Subject to any disclaimer, the term of this patent is extended or adjusted under 35 U.S.C. 154(b) by 231 days.

(21) Appl. No.: 11/336,094

(22) Filed: Jan. 20, 2006

(65) Prior Publication Data
US 2007/0170450 A1 Jul. 26, 2007

(51) Int. Cl.
*H01L 29/267* (2006.01)

(52) U.S. Cl. ............................. 257/99; 257/81; 257/433

(58) Field of Classification Search .................. 257/81, 257/98, 99, 79, 433
See application file for complete search history.

(56) References Cited

U.S. PATENT DOCUMENTS

| | | | |
|---|---|---|---|
| 5,914,501 | A | 6/1999 | Antle et al. |
| 6,274,924 | B1 | 8/2001 | Caret et al. |
| 6,531,328 | B1 | 3/2003 | Chen |
| 6,642,618 | B2 | 11/2003 | Yagi et al. |
| 6,818,464 | B2 | 11/2004 | Heschel |
| 6,856,717 | B2 | 2/2005 | Kilian |
| 6,876,008 | B2 | 4/2005 | Bhat et al. |
| 6,881,980 | B1 | 4/2005 | Ting |
| 6,969,204 | B2 | 11/2005 | Kilian |
| 7,165,896 | B2 | 1/2007 | Hauffe et al. |
| 2002/0008317 | A1* | 1/2002 | Engelhardt et al. .......... 257/704 |
| 2002/0070449 | A1 | 6/2002 | Yagi et al. |
| 2003/0094622 | A1 | 5/2003 | Horiuchi et al. |
| 2004/0079957 | A1* | 4/2004 | Andrews et al. ............ 257/100 |
| 2005/0029535 | A1* | 2/2005 | Mazzochette et al. ........ 257/100 |
| 2005/0121686 | A1* | 6/2005 | Keller et al. ................... 257/99 |
| 2005/0127485 | A1* | 6/2005 | Shei et al. .................... 257/678 |
| 2005/0180698 | A1 | 8/2005 | Hauffe et al. |
| 2005/0189555 | A1* | 9/2005 | Lin et al. ....................... 257/98 |
| 2005/0269688 | A1 | 12/2005 | Shiv |
| 2005/0274959 | A1* | 12/2005 | Kim et al. ..................... 257/79 |
| 2006/0006404 | A1 | 1/2006 | Ibbetson et al. |

FOREIGN PATENT DOCUMENTS

JP 11-251644 9/1999
JP 2001-15815 1/2001

OTHER PUBLICATIONS

"Assembly Informatin Luxeon Emitter," Jan. 20, 2006, http://www.lumileds.com/pdfs/AB10.PDF.
"Luxeon™ Benefits Over Competitive LED Products," Jan. 20, 2006, http://www.lumileds.com/pdfs/AB15.PDF.
"P5 Series InGaN LED Chips," Jan. 20, 2006, http://www.lumileds.com/pdfs/protected/DS39.PDF.

* cited by examiner

*Primary Examiner*—S. V Clark
(74) *Attorney, Agent, or Firm*—Fish & Richardson P.C.

(57) ABSTRACT

A package includes a substrate with a recess in which a light emitting element is mounted. A surface of the substrate forms an exterior surface of the package. A lid may be attached to the substrate to define a sealed region in which the light emitting element is mounted. The lid is transparent to a wavelength of light emitted by the light emitting element. Electrostatic discharge protection circuitry in the substrate is electrically coupled to the light emitting element.

17 Claims, 5 Drawing Sheets

PACKAGE FOR A LIGHT EMITTING ELEMENT WITH INTEGRATED ELECTROSTATIC DISCHARGE PROTECTION

TECHNICAL FIELD

This disclosure relates to a package for a light emitting device such as a light emitting diode.

BACKGROUND

Reduction in light emitting diode (LED) package size is an important factor in the design of various portable display technologies requiring compact design such as cell phones or handheld computers. Traditionally, LED's are housed in packages that include multiple components which occupy an area much larger than the LED chip itself. As shown in FIG. 6, the LED chip may be bonded to a thermally conductive sub-mount which contains electrostatic discharge (ESD) protection circuitry to prevent damage to the LED. The LED and sub-mount are further mounted on a heatsink slug and encapsulated within a pre-molded thermoplastic lens through which wide metal lead frames extend. For some applications, however, it may be desirable to reduce the package size.

SUMMARY

The present disclosure relates to improvements in packages for light emitting devices. According to one aspect, the package may include a substrate with a recess in which the light emitting element is mounted, wherein a surface of the substrate may form an exterior surface of the package. In some implementations, a lid, which is transparent to a wavelength of light emitted by the light emitting element can be attached, for example, to the substrate to define a sealed region in which the light emitting element is housed. ESD protection circuitry in the substrate may be electrically connected to the light emitting element.

Various implementations may include one or more of the following features. The package substrate may comprise, for example, a semiconductor material such as silicon. The light emitting element may comprise a light emitting diode. The sidewalls of the substrate recess can have a reflective coating wherein substantially all the sidewalls of the substrate recess are covered with the reflective coating. The reflective coating may include a highly reflective material such as metal.

The transparent lid may be hermetically sealed to the substrate, wherein the light emitting element is housed within the hermetically sealed region. The transparent lid may comprise glass.

The package may include electrically conductive feed-through material that extends from the recess through the substrate to the package exterior. Bond pads can be provided on the substrate, wherein the light emitting element is mounted to the substrate through the bond pads. Furthermore, the bond pads may electrically couple the light emitting element to the feed-through material. The ESD protection circuitry provided in the substrate may comprise, for example, a plurality of Zener diodes, and may be electrically connected in parallel with the light emitting element through the bond pads.

In various implementations, one or more of the following advantages may be present. Incorporating the ESD protection circuitry and electrical feed-through connections within the substrate can reduce the package size. Also, the substrate can include a thin membrane on which the light emitting element is supported to provide low thermal resistance for improved heat transfer. Additionally, the combination of ESD protection circuitry, feed-through connections, and sub-mount in one package may reduce the number of components to be assembled separately.

The metal coated sidewalls of the substrate recess can help to direct scattered light emitted by the light emitting element towards the transparent lid and out of the package. By directing more scattered light out of the package, the efficiency of the device may be improved. Mounting the element within the recess containing metal coated sidewalls allows the package to be used as both the reflector and container for the light emitting element.

By encapsulating the light emitting element within a hermetically sealed region, the reliability and lifetime of the encapsulated device can be improved.

Such a package may be used, for example, as an LED flash for cameras that are provided in mobile phones and devices. The small package creates additional available space that allows the size of the mobile device to be reduced. Furthermore, mobile devices with visible displays may use a plurality of such packages as display backlighting where close packing of light elements is necessary. Similarly, multiple packages may be combined to provide high resolution large area signs and displays.

Another application may include using several packages as automobile brake and head lights. In addition to the benefit of close packing, the thin membrane improves heat transfer away from the device.

The details of one or more embodiments of the invention are set forth in the accompanying drawings and the description below. Other features and advantages of the invention may be apparent from the description and drawings, and from the claims.

BRIEF DESCRIPTION OF DRAWINGS

Like reference symbols in the various drawings indicate like elements.

DETAILED DESCRIPTION OF THE PREFERRED EMBODIMENTS

Figure 1:
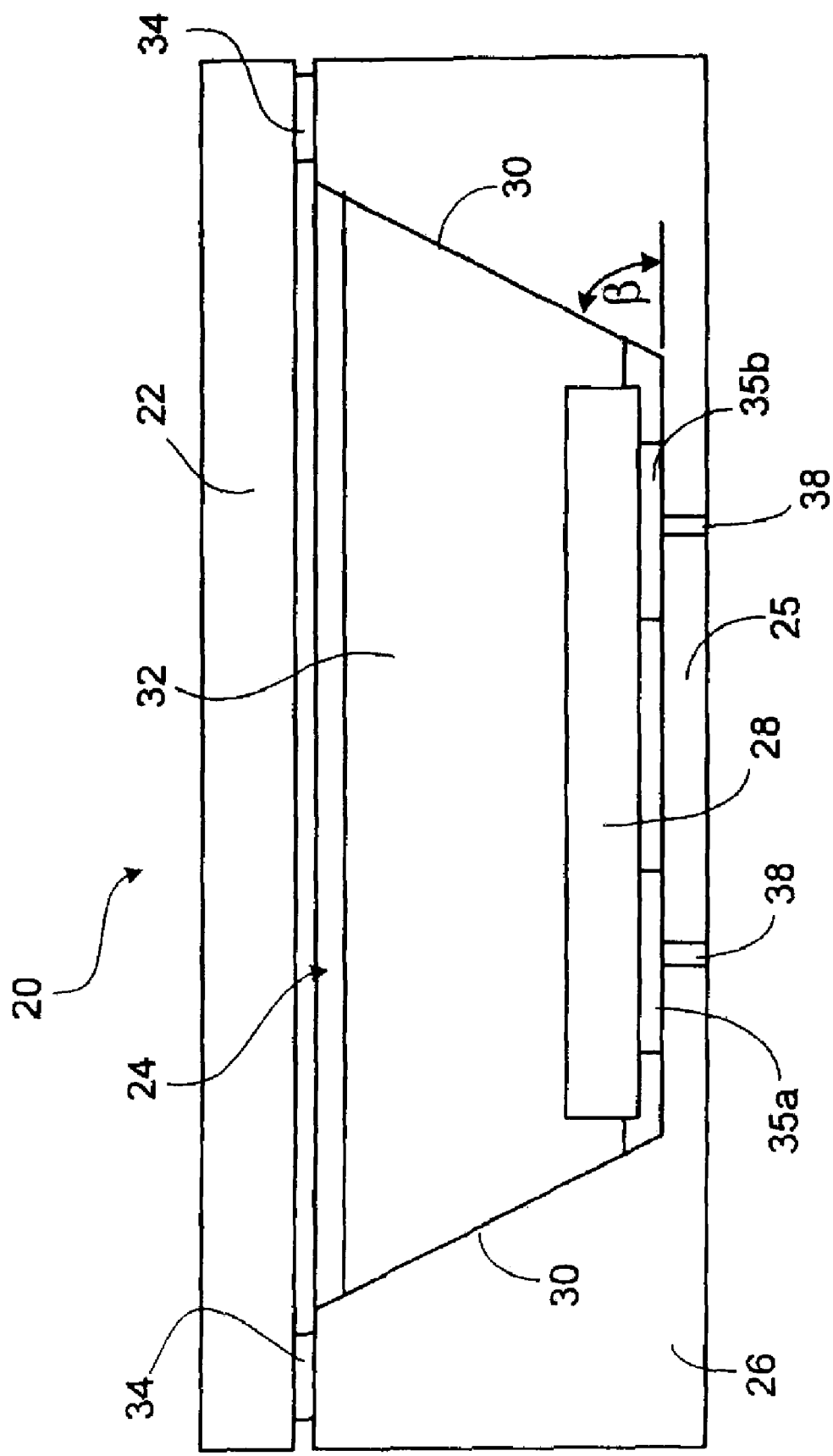
FIG. 1 illustrates a cross-sectional view of an optical package according to one implementation of the invention.

As shown in FIG. 1, a package 20 includes a lid 22, a recess 24 and a substrate 26. One or more opto-electronic devices may be mounted in the recess 24 between the substrate 26 and lid 22. In this particular implementation, the opto-electronic device is a light emitting diode (LED) 28.

The substrate 26 may comprise, for example, a semiconductor material such as silicon, so that the recess 24 may be formed by known etching processes. Anisotropic wet etching solutions such as potassium hydroxide may be used to form slanted sidewalls 30. In the implementation of FIG. 1, at least one of the sidewalls 30 of the recess 24 is slanted at an angle $\beta$ of about 54.7°. The angle of the sidewalls 30 may differ in other implementations. The etching process leaves a thin membrane 25 on which the LED 28 may be supported. The sidewalls 30 may be coated with a material, such as metal, which acts as a reflecting surface 32 to redirect stray light exiting from the LED 28 towards the lid 22.

Figure 2:
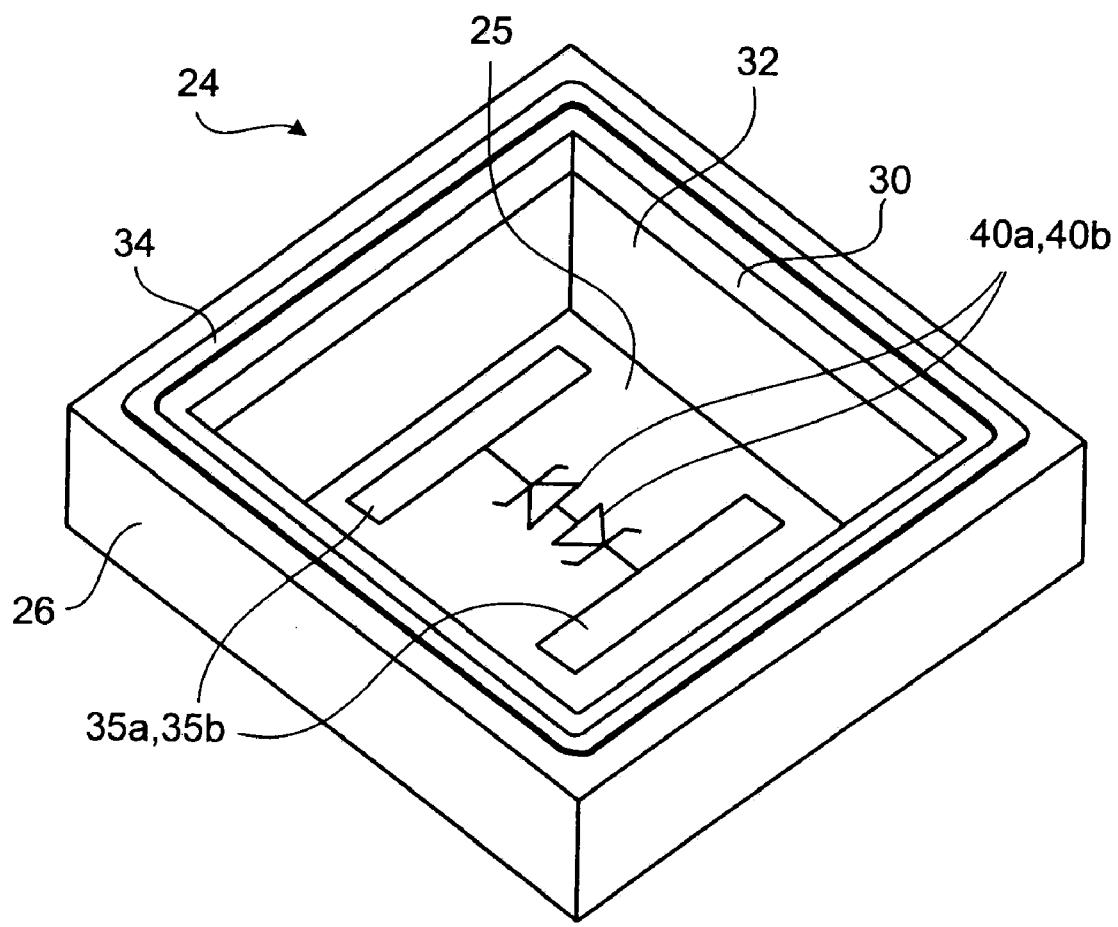
FIGS. 2-4 illustrate various details of the package of FIG. 1.
Figure 3:
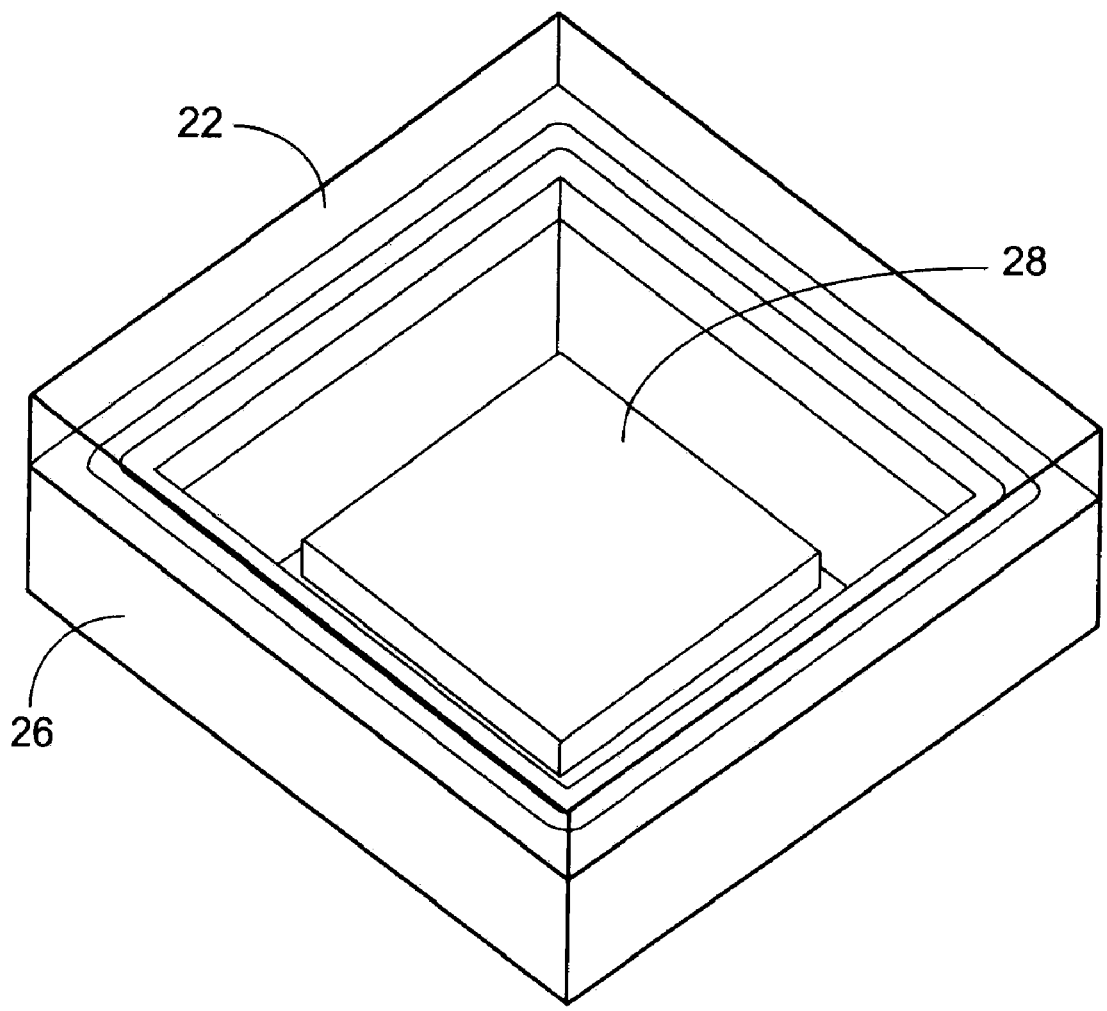

The lid 22 should comprise a material such as glass or silicon, that is transparent to at least a specified wavelength of light (or a band of wavelength) emitted by the LED 28. Preferably, the lid 22 is positioned over and covers the entire recess 24. As shown in FIG. 2, a metal ring 34, which circumscribes the recess 24 may be formed on the surface of the substrate 26. A hermetic seal may be formed when the lid 22, which is positioned over the entire recess 24, is fused to the metal ring 34 using, for example, a solder reflow process.

Figure 4:
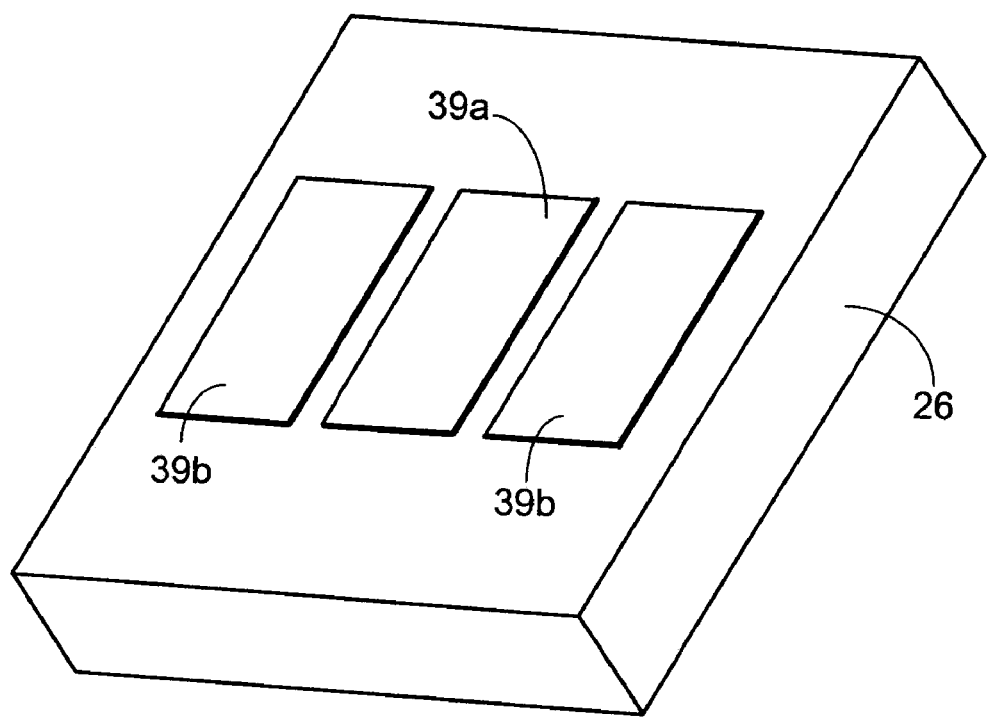

The LED 28 may be mounted in the recess 24, for example, by soldering the device onto bond pads 35a and 35b, which are deposited and patterned at the bottom of the recess 24 (see FIGS. 1-2). Preferably, the bond pads 35a, 35b comprise an electrically conducting material such as metal. As shown in FIG. 1, the bond pads 35a, 35b may be provided on a portion of the surface of thin membrane 25 which includes electrically conductive feed-through material 38 formed in the thin membrane 25. The electrically conductive feed-through material 38 provides electrical contact from the LED 28 and bond pads 35a, 35b through substrate 26 to the package exterior. Alternatively, bond wires or other electrical connections may be provided to connect the LED 28 to the conductive feed-through material 38. The conductive feed-through material 38 may be provided, for example, using an electroplated feed-through metallization process and allows the LED 28 to remain sealed hermetically within the package. In a particular implementation, hermetically sealing the through-holes includes providing an adhesion layer, a plating base, a feed-through metallization, a diffusion barrier, a wetting layer, and an anti-oxidation barrier that comprises, for example, a noble metal. In applications where improved heat transfer between the package and an external support is desired, metal pads 39a may be provided on the package exterior on a side opposite the recess 24 (see FIG. 4). Additionally, metal pads 39b may cover and electrically connect to conductive feed-through material 38 as well as provide improved heat transfer to an external support.

Figure 5:
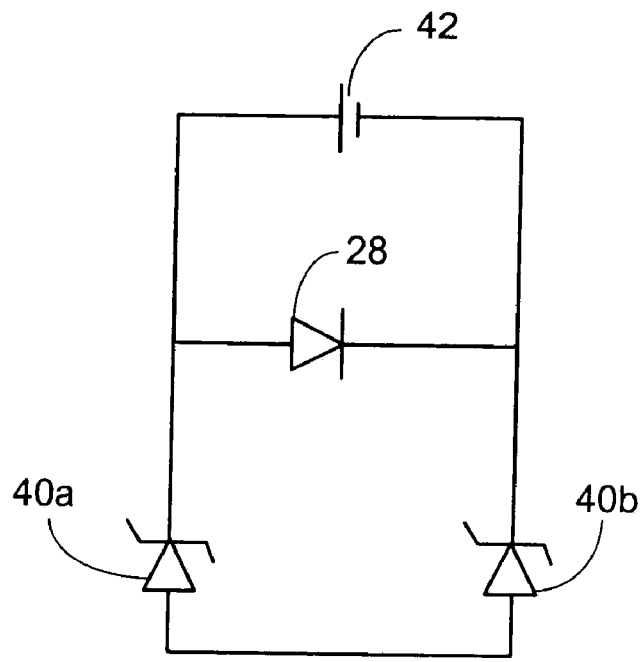
FIG. 5 illustrates a circuit schematic of the LED and ESD circuitry.
Figure 6:
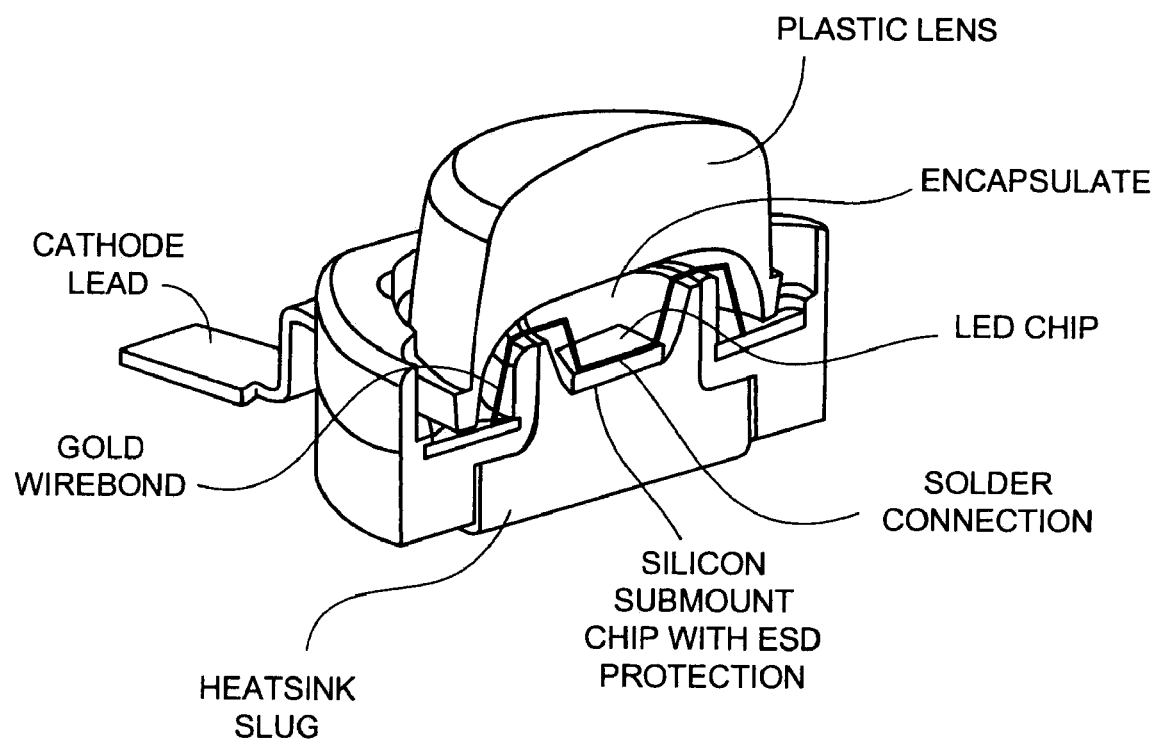
FIG. 6 illustrates a known package arrangement.

To provide protection from damage to the LED 28 that may occur as a result of excess electrical charge, electrostatic discharge (ESD) protection circuitry 40 may be formed in the thin membrane 25 region of the substrate 26 (see FIG. 2), for example, by a phosphorus and boron diffusion process. Preferably, the ESD circuitry 40 is connected in parallel with the LED 28 through the bond pads 35a, 35b. In the present implementation, for example, the ESD circuitry 40 comprises two zener diodes 40a, 40b configured back-to-back. FIG. 5 shows a circuit schematic of the ESD circuitry connected to the LED 28 and an external voltage supply 42. When excess electrical charge creates a voltage (V) across the LED 28 that exceeds a threshold voltage, the ESD circuitry 40 clamps the voltage (V) to a clamp voltage and diverts a current ($I_s$) from the LED 28. The threshold voltage and clamp voltage are determined by the breakdown voltages of the zener diodes under reverse bias and the threshold voltages of the zener diodes under forward bias.

A number of embodiments of the invention have been described. Nevertheless, it will be understood that various modifications may be made without departing from the spirit and scope of the invention. Accordingly, other embodiments are within the scope of the following claims.

What is claimed is:

1. A package comprising:
   a substrate including a recess;
   a light emitting element mounted to the substrate within the recess, wherein a surface of the substrate forms an exterior surface of the package and wherein an electrically conductive feed-through metal extends from the recess through the substrate to an exterior of the package;
   electrostatic discharge protection circuitry in the substrate, wherein the electrostatic discharge protection circuitry is electrically connected to the light emitting element;
   a lid attached to the substrate to define a region in which the light emitting element is housed, wherein at least part of the lid is transparent to a wavelength of light that the light emitting element is adapted to emit; and
   a metal ring circumscribing the recess, wherein the metal ring is fused to the lid to hermetically seal the lid to the substrate, wherein the light emitting element is hermetically sealed within the package.

2. The package of claim 1 wherein the transparent lid comprises glass.

3. The package of claim 1 wherein the light emitting element comprises a light emitting diode.

4. The package of claim 1 wherein sidewalls of the recess include a reflective coating.

5. The package of claim 4 wherein the reflective coating substantially covers all surfaces of the sidewalls.

6. The package of claim 4 wherein the reflective coating comprises metal.

7. The package of claim 1 wherein the feed-through metal is electrically connected to the light emitting element.

8. The package of claim 1 including metal pads on the exterior surface of the substrate and coupled electrically to the feed-through metal.

9. The package of claim 1 wherein the electrostatic discharge protection circuitry comprises a plurality of Zener diodes.

10. The package of claim 1 wherein the substrate comprises a semiconductor material.

11. The package of claim 1 wherein the substrate comprises silicon.

12. The package of claim 1 including bond pads on the substrate, wherein the light emitting element is mounted to the substrate through bond pads.

13. The package of claim 1 wherein the electrostatic discharge protection circuitry is electrically connected in parallel with the light emitting element through bond pads.

14. The package of claim 1 wherein the light emitting element is supported on a thin membrane.

15. A package comprising:
   a substrate including a recess, wherein the substrate comprises a semiconductor material, wherein an electrically conductive feed-through metal extends from the recess through the substrate to an exterior of the package, and wherein sidewalls of the recess include a reflective coating;
   a light emitting element mounted to the substrate within the recess, wherein a surface of the substrate forms an exterior surface of the package;
   a lid attached to the substrate to define a hermetically sealed region in which the light emitting element is housed, wherein at least part of the lid is transparent to a wavelength of light that the light emitting element is adapted to emit;
   electrostatic discharge protection circuitry in the substrate wherein the electrostatic discharge protection circuitry is electrically connected to the light emitting element;
   a metal ring circumscribing the recess, wherein the metal ring is fused to the lid to hermetically seal the lid to the substrate, wherein the light emitting element is hermetically sealed within the package.

16. The package of claim 15 wherein the electrostatic discharge protection circuitry comprises a plurality of Zener diodes.

17. The package of claim 15 wherein the substrate comprises silicon.

* * * * *

UNITED STATES PATENT AND TRADEMARK OFFICE
CERTIFICATE OF CORRECTION

PATENT NO. : 7,528,422 B2  Page 1 of 1
APPLICATION NO. : 11/336094
DATED : May 5, 2009
INVENTOR(S) : Thomas Murphy It is certified that error appears in the above-identified patent and that said Letters Patent is hereby corrected as shown below:

Title page, Column 2, Other Publications, Line 1, delete "Informatin" and insert --Information--.

Signed and Sealed this

Fourteenth Day of July, 2009

JOHN DOLL
*Acting Director of the United States Patent and Trademark Office*